United States Patent [19]

Wetzel

[11] Patent Number: 4,785,279
[45] Date of Patent: Nov. 15, 1988

[54] INTEGRATED CIRCUIT RESISTOR HAVING BALANCED FIELD PLATE

[75] Inventor: Alan T. Wetzel, McKinney, Tex.

[73] Assignee: Texas Instruments Incorporated, Dallas, Tex.

[21] Appl. No.: 940,820

[22] Filed: Dec. 12, 1986

[51] Int. Cl.[4] .............................................. H01C 1/012
[52] U.S. Cl. ..................................... 338/314; 338/295
[58] Field of Search ............... 338/295, 314, 277, 230, 338/308

[56] References Cited

U.S. PATENT DOCUMENTS 2,984,805  5/1961  Webb ................................. 338/277

FOREIGN PATENT DOCUMENTS 2039154  7/1980  United Kingdom ................ 338/295

Primary Examiner—Harold Broome
Assistant Examiner—M. N. Lateef
Attorney, Agent, or Firm—Thomas R. FitzGerald; Leo N. Heiting; Melvin Sharp

[57] ABSTRACT

The disclosure relates to integrated circuit resistors and matched resistor pairs wherein each resistor is split into plural segments, each segment having a separate field plate thereover, each segment having the field plate associated therewith connected to the non-common node thereof. In the case of the matched resistor pair, the interconnections between the segment of each resistor overlap. The segments are preferably substantially rectangular in shape with the major axes of all segments parallel to each other.

18 Claims, 2 Drawing Sheets

INTEGRATED CIRCUIT RESISTOR HAVING BALANCED FIELD PLATE

BACKGROUND OF THE INVENTION

1. FIELD OF THE INVENTION

This invention relates to resistors in integrated circuits and, more specifically, to integrated circuit resistors having balanced field plates connected thereto.

2. BRIEF DESCRIPTION OF THE PRIOR ART

The formation of resistors as parts of integrated circuits on a chip is a long established art. However, in the formation of such resistors in integrated circuits, there has been a serious stability problem with the resistor values and the ability to maintain the parameter values of matched resistors the same during circuit operation. The value of diffused or implanted resistors in silicon integrated circuits can be affected by electrostatic fields around the body of the resistor. Any variation in these fields, such as would be caused by mobile ion movement, or by polarization of the surface oxide/phosphosilicate glass layers over the resistors, can change the parameter values of the resistors. In circuit designs using matched components, shifting resistor values can lead to operating problems, such as, for example, threshold shifts or common mode voltage sensitivity.

The use of field plates is well known for use in connection with bipolar integrated circuits to prevent parasitic PMOS formation. The parasitic PMOS if formed between adjacent p-type regions by the inversion of the lightly doped n-type epitaxial layer separating the p-type regions. This inversion of the epitaxial layer can be caused, for example, by a negative potential applied to a metal interconnect lead crossing over the epitaxial layer or by an accumulation of negative charges in or on the oxide layer covering the epitaxial layer. If this parasitic PMOS device becomes active due to the inversion and conducts current, then the operation of the designed device will be impaired.

Field plates designed for parasitic PMOS elimination comprise an extension of the metalization layer tied to the p-type region. The metal extends over the epitaxial layer beyond the p-type region/epitaxial layer junction. The field plate metalization is connected electrically to the p-type region with the more positive electrical potential, which is the source terminal of the parasitic PMOS. The metal extending out over the epitaxial layer forms the gate terminal of the parasitic PMOS. The metal gate is extended out over the epitaxial region a distance which is sufficient to withstand the applied voltage. The electrical connection of the gate terminal to the source terminal keeps the parasitic PMOS turned off. This means that there is no current flow from the source terminal, up to the breakdown voltage of the device.

In oxide sidewall isolated processes, such as those using insulating silicon dioxide for isolation between adjacent circuit regions rather than the older traditional junction diode isolation, the p-type region source terminals of parasitic PMOS transistors can be surrounded by isolation oxide. There is a potential path for parasitic PMOS formation under the isolation oxide, but the voltages required to turn on the parasitic PMOS are much higher than in the junction isolated case. This is due to the greater thickness of the isolation oxide, compared with the thickness of normal oxide over epitaxial layers. Because of this, the need for the traditional field plates is reduced or eliminated.

Another surface charge and inversion problem can occur which will not be solved through the use of traditional field plates. In lightly doped p-type region resistors, wherein there is greater susceptibility to stability problems, changing surface charge conditions can modulate the resistor values. This is an action similar to a depletion mode MOS device, since the p-channel exists under conditions of no bias.

This change of resistor values can be a significant or fatal problem in circuits whose operation is dependent upon close matching or ratioing of component values, such as in linear differential line receivers.

SUMMARY OF THE INVENTION

In accordance with the present invention, the above noted impediments of the prior art are minimized and there is provided a resistor in an integrated circuit having stable parameter values which and maintain that condition during circuit operation by use of a field plate.

In accordance with another aspect of the invention invention, and considering the fact that the mobile ion/PSG polarization effects do not appear preventable, the solution to the circuit stability problem is to find a way to compensate for the shifts in parameter values. One approach is to split the sensitive resistors into one or more pairs of series connected equal parts, and to cover each individual segment with a field plate connected to the outside (non common node) ends of the series connected resistor elements. In a one pair split, the segment connected to the more positive potential will be covered by a field plate connected to that positive potential, while the other segment will be covered by a field plate connected to the terminal having a more negative potential. The use of field plates for stabilization of the values of resistors is not known in the prior art and the specific field plate arrangement utilized herein is not known in the prior art in any environment.

Because of the equal voltage drops across each resistor segment, the vertical electrical fields between each of the resistor segments and its covering field plate will be complimentary within the resistor pairs. It is this equal but opposite or balanced field condition that provides the compensation for the resistor parameter changes. A field over one resistor segment which causes an increase in the resistance of that segment will be matched by an equal but opposite field over a second segment of that resistor and the resistance of the second segment will be decreased in substantially equal amount. The increase in resistance of one segment of the resistor is therefore compensated by the decrease in resistance of the second resistor segment.

An alternative approach to the balanced field plate design is to connect the field plates for individual resistor segment pairs to the internal (common node) ends of the resistor pairs. The complementary field conditions and the equal but opposite resistor parameter change compensation will occur as described hereinabove.

It should be understood that the invention disclosed herein can be applied to any integrated circuit design whose operation is dependent upon proper matching of the values of pairs of resistors. Such circuits are primarily of a linear or interface category and include, among others, data communication circuits, telecommunica-

DESCRIPTION OF THE PREFERRED EMBODIMENT

Figure 1:
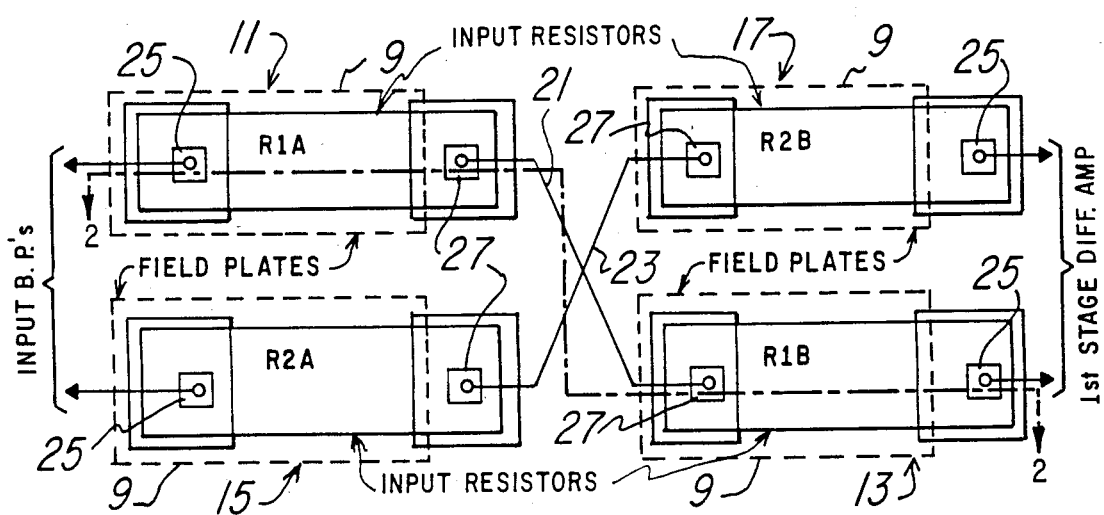
FIG. 1 is a top view of a resistor/field plate arrangement according to the prior art.
Figure 2:
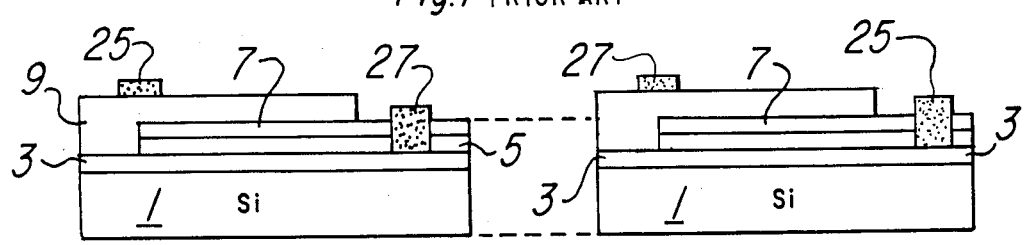
FIG. 2 is a cross section along the line 2—2 of FIG. 1.
Figure 3:
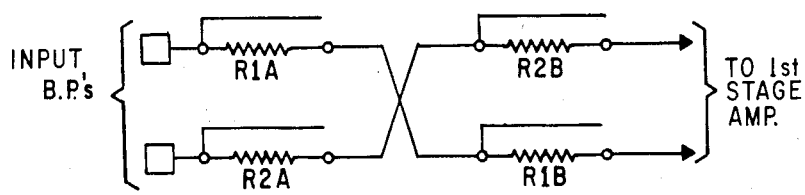
FIG. 3 is a schematic diagram of the circuit of FIGS. 1 and 2.

Referring first to FIGS. 1 and 2, there is shown a resistor/field plate arrangement. Each resistor of the resistor pair shown in FIG. 1 includes two segments, 11 and 13 in the case of resistor R1 and 15 and 17 in the case of resistor R2. As can be seen in FIG. 1, the segments of resistor R1, being R1A and R2B, and R2, being R2A and R2B are interlaced, as is well known in the prior art, for minimization of stability problems with segments R1A and R2B having a common major axis and segments R2A and R1B having a common major axis 32. The major axis is the line along the length of a segment about which the segment is symmetrical. The segments of each resistor are connected together, such as by a conductor 21 or 23. The resistor/field plate arrangement of each resistor segment 11, 13, 15 and 17 is the same and is a part of an integrated circuit formed in a silicon substrate 1 (FIG. 2) which includes the integrated circuit thereon including the resistor/field plate arrangement. A doped area 3 with standard dopant and standard dopant concentration in a known range for resistors is formed at the surface of the substrate in a known manner. A typical dopant can be boron in a concentration range of from about 1 to $1.5 \times 10^{18}$ atoms/cm$^2$. Since the dopants and their concentrations are well known in the art and form no part of this invention, they will not be further discussed herein. A silicon oxide layer 5 is then formed on the surface of the substrate by well known procedures, such as thermal growth, and a layer of phosphosilicate glass (PSG) 7 is then formed over the silicon oxide. A field plate 9 of aluminum is then formed over the glass 7, the field plate contacting the surface of the doped area 3 at the input end of each resistor segment 11 and 15 as shown in FIGS. 1 and 3. This procedure and arrangement is found for each of the resistor segments 11, 13 and 15, 17. It can be seen that the resistor segments 11, 13 form a single resistor of two segments and resistor segments 15, 17 form a single resistor of two segments. Each resistor segment has a pair of pads 25 and 27 at opposite ends thereof, the pads 25 being disposed at the inputs and outputs of the resistors and the pads 27 being used to interconnect the segments of each resistor. The pads 25 and 27 extend through the glass layer 7 and oxide layer 5 to the doped area 3. The resistors are a matched pair and will have substantially identical properties under most conditions. However, as stated hereinabove, when mobile ions are present and/or polarization of the phosphosilicate glass takes place, these conditions may not be equal for each resistor, thereby eliminating the matched parameter condition. The existence of field plates over the resistor bodies cannot totally prevent horizontal movement of mobile ions along the silicon/oxide interface, nor can it prevent vertical movement within the oxide itself.

Increasing the phosphorous content of the surface oxide to getter mobile ions results in the presence of a layer of phosphosilicate glass (PSG) as part of the oxide layer. This PSG layer is subject to a polarization phenomenon when exposed to an electrical field.

In such devices, during circuit operation, there will be a voltage drop along the length of the resistor, but the field creates a vertical electrical field between the body of the resistor and the field plate. The strength of this field varies as a function of position along the length of the resistor. With the traditional field plate connection of an applied differential voltage, the individual resistors in a matched pair will be exposed to different electrical fields.

The non-matched electrical fields will lead to differences in the mobile ion/PSG polarization conditions over the surface of the resistors. Both the ion mobility and PSG polarization effects are accelerated under conditions of combined high temperature and applied differential voltage. Conditions such as this can occur during actual circuit operation, and also occur during some phases of an integrated circuit's reliability qualification process, such as the high temperature-reversed bias (HTRB) test. If the applied voltages are maintained while the device is cooled down, any ions which have moved, or any polarization of the PSG glass which has occurred, will become trapped or permanent.

It is this difference in surface charges and fields that leads to a depletion mode MOS action, which can cause resistor matching changes. In the case of differential line receivers, these effects manifest themselves as shifts of thresholds, or changes in common mode voltage sensitivity.

It is therefor readily apparent that an improvement in matching of resistors as well as the stability thereof in integrated circuits as compared with the prior art will provide a significant improvement in circuit performance. It is also readily apparent that the conventional application of field plates, as used in other areas for entirely different purposes do not completely solve the problem of instability in resistor parameters as noted above, the cause of this instability also not being completely understood at this time.

Figure 4:
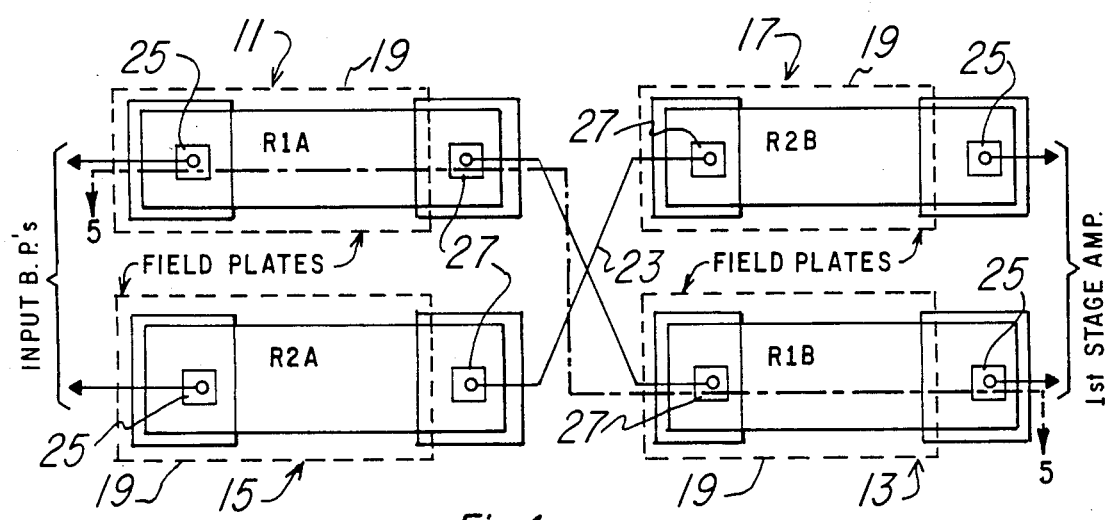
FIG. 4 is a top view of a resistor/field plate arrangement according to the present invention.
Figure 5:
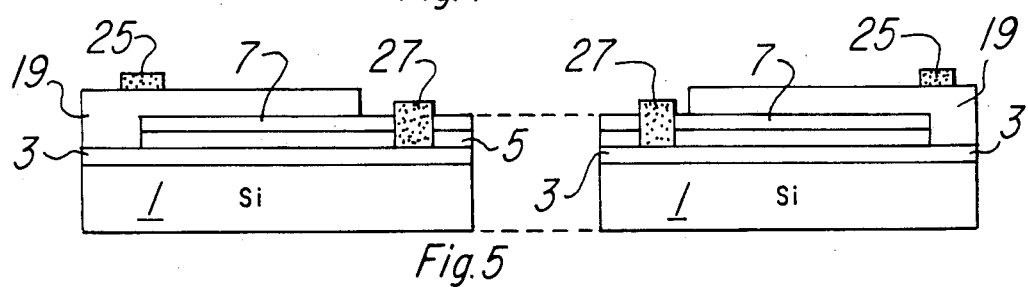
FIG. 5 is a cross section along the line 5—5 of FIG. 4.
Figure 6:
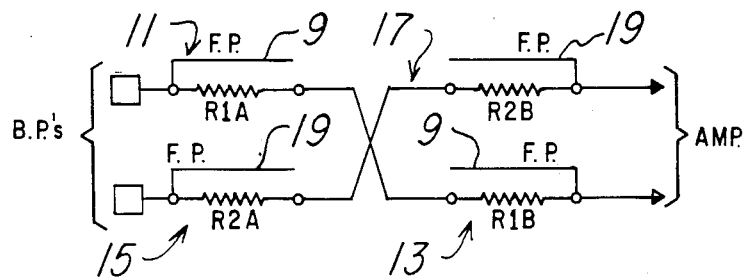
FIG. 6 is a schematic diagram of the circuit of FIGS. 4 and 5.

The problem, which is partially remedied in the embodiment of FIGS. 1 to 3, is remedied to an even greater extent in the embodiment of FIGS. 4 to 6 wherein identical character references denote the same or similar structures to those of FIGS. 1 to 3. As can be seen, the resistor arrangements are identical to those of FIGS. 1 to 3 except that the field plates 19 at the downstream resistor segments 13 and 17 are coupled to the downstream or output ends of their associated resistor segments. This causes a condition in the downstream resistor segment which is opposite to that in the upstream resistor segment and thereby causes a cancellation of any induced resistor segment parameter changing conditions present. In this manner, resistor pairs can be provided in integrated circuits which can be matched to a high degree and which retain the match under conditions which would normally tend to alter the parameters of one of the resistors more than the matching member of the pair.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. An integrated circuit resistor, comprising:
   (a) a substrate having first and second resistor segments formed therein, each segment having a first and second end,
   (b) means electrically interconnecting the second end of said first resistor segment with the first end of the second resistor segment,
   (c) a field plate disposed over a part of said first resistor segment and electrically coupled to the first end of said second resistor segment, and
   (d) a field plate disposed over a part of said second resistor segment and electrically coupled to the second end of said second resistor segment.

2. An integrated circuit resistor as set forth in claim 1, wherein each of said resistor segments has a substantially rectangular shape with a major axis, the major axis of said first segment being parallel to the major axis of said second segment.

3. An integrated circuit resistor as set forth in claim 2, wherein the major axis of said first segment is offset from the major axis of said second segment.

4. An integrated circuit resistor as set forth in claim 1, wherein said substrate further includes third and fourth resistor segments formed therein, each segment having a first and second end, means electrically interconnecting the second end of said third resistor segment with the first end of the fourth resistor segment, a field plate disposed over a part of said third resistor segment and electrically coupled to the first end of said fourth resistor segment, and a field plate disposed over a part of said fourth resistor segment and electrically coupled to the second end of said fourth resistor segment.

5. An integrated circuit resistor as set forth in claim 4, wherein each of said third and fourth resistor segments has a substantially rectangular shape with a major axis, the major axis of said third segment being parallel to the major axis of said fourth segment.

6. An integrated circuit resistor as set forth in claim 5, wherein the major axis of said third segment is offset from the major axis of said fourth segment.

7. An integrated circuit resistor as set forth in claim 4, wherein said means electrically coupling said first and second segments overlaps said means electrically coupling said third and fourth segments.

8. An integrated circuit resistor as set forth in claim 4, wherein said major axes of said first, second, third and fourth segments are all substantially parallel to each other.

9. An integrated circuit resistor as set forth in claim 2, wherein said substrate further includes third and fourth resistor segments formed therein, each segment having a first and second end, means electrically interconnecting the second end of said third resistor segment with the first end of the fourth resistor segment, a field plate disposed over a part of said third resistor segment and electrically coupled to the first end of said fourth resistor segment, and a field plate disposed over a part of said fourth resistor segment and electrically coupled to the second end of said fourth resistor segment.

10. An integrated circuit resistor as set forth in claim 9, wherein each of said third and fourth resistor segments has a substantially rectangular shape with a major axis, the major axis of said third segment being parallel to the major axis of said fourth segment.

11. An integrated circuit resistor as set forth in claim 10, wherein the major axis of said third segment is offset from the major axis of said fourth segment.

12. An integrated circuit resistor as set forth in claim 9, wherein said means electrically coupling said first and second segments overlaps said means electrically coupling said third and fourth segments.

13. An integrated circuit resistor as set forth in claim 9, wherein said major axes of said first, second, third and fourth segments are all substantially parallel to each other.

14. An integrated circuit resistor as set forth in claim 3, wherein said substrate further includes third and fourth resistor segments formed therein, each segment having a first and second end, means electrically interconnecting the second end of said third resistor segment with the first end of the fourth resistor segment, a field plate disposed over a part of said third resistor segment and electrically coupled to the first end of said fourth resistor segment, and a field plate disposed over a part of said fourth resistor segment and electrically coupled to the second end of said fourth resistor segment.

15. An integrated circuit resistor as set forth in claim 14, wherein each of said third and fourth resistor segments has a substantially rectangular shape with a major axis, the major axis of said third segment being parallel to the major axis of said fourth segment.

16. An integrated circuit resistor as set forth in claim 15, wherein the major axis of said third segment is offset from the major axis of said fourth segment.

17. An integrated circuit resistor as set forth in claim 14, wherein said means electrically coupling said first and second segments overlaps said means electrically coupling said third and fourth segments.

18. An integrated circuit resistor as set forth in claim 14, wherein said major axes of said first, second, third and fourth segments are all substantially parallel to each other.

* * * * *